United States Patent [19]

Gedaly et al.

[11] 4,356,042

[45] Oct. 26, 1982

[54] METHOD FOR FABRICATING A SEMICONDUCTOR READ ONLY MEMORY

[75] Inventors: Jerrell M. Gedaly, Dallas; Joseph P. Sadowski; David D. Kirkland, both of Coppell; Frank J. Sigmund, Dallas, all of Tex.

[73] Assignee: Mostek Corporation, Carrollton, Tex.

[21] Appl. No.: 265,986

[22] PCT Filed: Nov. 7, 1980

[86] PCT No.: PCT/US80/01494

§ 371 Date: Nov. 7, 1980

§ 102(e) Date: Nov. 7, 1980

[51] Int. Cl.$^3$ .................... H01L 21/265; B01J 17/00
[52] U.S. Cl. ................................... 148/1.5; 29/571;
29/576 B; 29/578; 148/187; 357/23; 357/45; 357/91
[58] Field of Search ............... 148/1.5, 187; 29/571, 29/576 B, 578; 357/23 VT, 45, 91

[56] References Cited

U.S. PATENT DOCUMENTS

| | | | |
|---|---|---|---|
| 4,129,936 | 12/1978 | Takei | 29/571 |
| 4,208,780 | 6/1980 | Richman | 29/571 |
| 4,230,504 | 10/1980 | Kuo | 148/1.5 |
| 4,231,051 | 10/1980 | Custode et al. | 29/571 |
| 4,268,950 | 5/1981 | Chattersee et al. | 29/571 |
| 4,272,303 | 6/1981 | Chattersee et al. | 148/1.5 |
| 4,290,184 | 9/1981 | Kuo | 29/571 |

OTHER PUBLICATIONS

Knepper, IBM-TDB, 15 (1973) 2919.

*Primary Examiner*—Upendra Roy

[57] ABSTRACT

A process is disclosed for manufacturing a read only memory in which the specified bit pattern is fabricated into the memory at a late stage in the manufacturing cycle. Before the bit pattern is implanted into a ROM memory cell device (10), the cell is fabricated such that a substrate (12) has source (38) and drain (40) regions therein. A gate oxide (28) is positioned above the channel region of the device (10). A poly gate (30) is positioned immediately above the gate oxide (28) and below an oxide insulating layer (42). A further layer (45) of silicon dioxide is fabricated above the insulating layer (42). Metal contacts (48, 50) are fabricated to be in contact with the source region (38) and drain region (40) of device (10). A masking oxide (56) is deposited over the entire surface of the device (10). To incorporate the desired bit pattern a selected cell is ion-implanted to raise the voltage threshold of the cell. After masking with the customer pattern the insulating layer (45) is completely etched through and the insulating layer (42) is partially etched through above the poly gate (30a). An ion stream (60) is projected into the device (10) with sufficient energy to force the ions through the partially etched layer of silicon dioxide (42) plus the poly gate (30) and gate diode (28) into the channel region of the substrate (12). After the implant step is completed, a layer (64) of top glass is applied to cover the surface of device (10). The glass (64) is then etched to provide openings for bonding pads. The read only memory can be fabricated and parametrically tested before the bit pattern is implanted and only a few manufacturing steps are required to complete the fabrication of the memory after the ion-implantation.

4 Claims, 10 Drawing Figures

METHOD FOR FABRICATING A SEMICONDUCTOR READ ONLY MEMORY

TECHNICAL FIELD

The present invention pertains to semiconductor memory circuits and in particular to the fabrication of bit patterns into the memory cells of a read only memory (ROM).

BACKGROUND ART

Read only memory circuits are manufactured to have a predetermined bit pattern permanently fixed in the memory cells. Fabrication of a ROM memory circuit starts with a blank silicon substrate and processing of the substrate requires a substantial number of manufacturing steps. A typical manufacturing cycle requires approximately 20 days. It has heretofore been the conventional practice to incorporate the customer bit pattern into the memory circuit at an early stage in the processing, for example, at contact etch. As circuit details have become smaller and designs incorporate shared column and data lines, ion implantation has been selected over the contact etch step to implant the desired threshold levels into the channel regions of the memory cells. This placed the programming step even earlier in the process sequence. In process time this meant that approximately 15 days elapsed between the time the programming step was implemented and the time the part was completed. The fixing of the bit pattern into the circuit at an early stage in the processing has a number of drawbacks. The primary problem is that of customer response time, that is, the time between receipt of the desired bit pattern by the manufacturer and the completion of the fabrication of the memory circuit. When the bit pattern is incorporated at a relatively early point in the manufacturing sequence, then the response time must include most of the steps in the entire manufacturing cycle.

A further problem is that the yield of good dies from a wafer cannot be determined until the memory cells are completely fabricated. Conventionally the memory cells cannot be parametrically or functionally tested until long after the bit pattern is encoded and the die is committed to a specific customer. Therefore, the manufacturer must commit a sufficient number of wafers to produce the number of parts ordered after estimating the losses which will be incurred in the manufacturing process. If the yield of products is lower than anticipated, there will be an insufficient number of parts to meet the customer's requirements and if the yield proves to be greater than expected there will be good parts produced for which there is no customer order.

Further, if there should be an error in the customer supplied programming pattern or if there should be a major flaw in the manufacturing process, the mistake will not be detected until the entire cycle is essentially complete. Once the error is found and corrected, the new parts will not be available until another complete manufacturing cycle is started and completed.

From the above it can be seen that the impact of these problems could be reduced if it were possible to delay the incorporation of the customer bit pattern into the read only memory circuit until a late stage in the manufacturing operation. This would make it possible for the manufacturer to build an inventory of uncommitted parts, to parametrically test these parts, and to provide a rapid customer response by completing only the final processing operations required to incorporate the customer bit pattern into the memory circuit.

Therefore, there exists a need for a manufacturing process for producing a reliable ROM circuit, but which delays the incorporation of the customer bit pattern until a late stage of processing.

SUMMARY OF THE INVENTION

The present invention relates to a method for producing a ROM semiconductor device having a selected bit pattern implanted therein. An illustrative embodiment method of the present invention comprises essentially the steps of:

(a) Fabricating a plurality of memory cells on a semiconductor substrate where the memory cells are separated by field oxide, each cell having doped source and drain regions in the substrate on each side of a non-implanted channel region, a gate oxide immediately above the channel region, a polysilicon gate immediately above the gate oxide, an oxide layer above the polysilicon gate, and metal contacts extending through the oxide layer for contact with the respective source and drain regions.

(b) Etching the oxide layer above the channel regions for selected ones of the memory cells in accordance with the selected bit pattern thereby essentially exposing the polysilicon gates of the selected memory cells.

(c) After etching the oxide layer, exposing the device to a stream of ions having sufficient energy to penetrate the essentially exposed polysilicon gates and underlying gate oxides in order to implant the corresponding channel regions thereby changing the voltage thresholds of the selected memory cells, the ions having insufficient energy to effectively penetrate to the regions of said substrate not below the etched regions of the oxide layer.

(d) Covering the surface of the device with a passivation layer after implanting the channel regions of the selected memory cells.

BRIEF DESCRIPTION OF THE DRAWINGS

For a more complete understanding of the present invention and the advantages thereof, reference is now made to the following description taken in conjunction with the accompanying drawings in which.

It will be appreciated that for simplicity and clarity of explanation the Figures have not necessarily been drawn to scale.

DETAILED DESCRIPTION

The sequence for manufacturing a read only memory (ROM) in accordance with the method of the present invention is now described in the following sequence of steps. The memory circuit as a whole comprises a plurality of memory cell sites. Although the memory cell sites are essentially the same physically, as herein described below certain ones of the memory cells will be implanted to have a significantly higher threshold voltage than the other memory cells. The change in the threshold voltage is the means by which the customer's bit pattern is incorporated into the memory circuit. The following description is directed to the fabrication of a single memory cell which is representative of each of the plurality of cells in the overall memory circuit.

Figure 1:
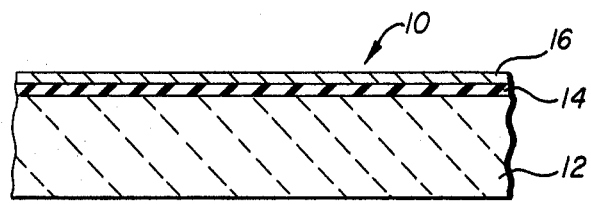
FIG. 1 is a cross-sectional view of a silicon substrate having oxide and nitride layers on the surface thereof.

Referring now to FIG. 1, the semiconductor memory device as a whole is referred to by the reference numeral 10. Fabrication of the device 10 begins with a thin silicon substrate 12 on the surface of which is formed a silicon dioxide layer 14 and over that a nitride layer 16. These layers are formed by processes well known in the art.

Figure 2:
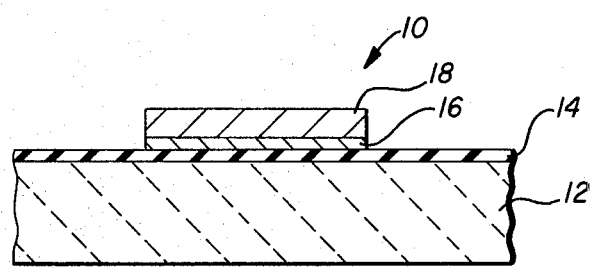
FIG. 2 is a cross-sectional view of the substrate of FIG. 1 in which a portion of the nitride layer has been etched.

Referring now to FIG. 2, a photoresist layer 18 is patterned over the nitride layer 16. The nitride layer is then etched leaving only the portion 16 shown in FIG. 2.

Figure 3:
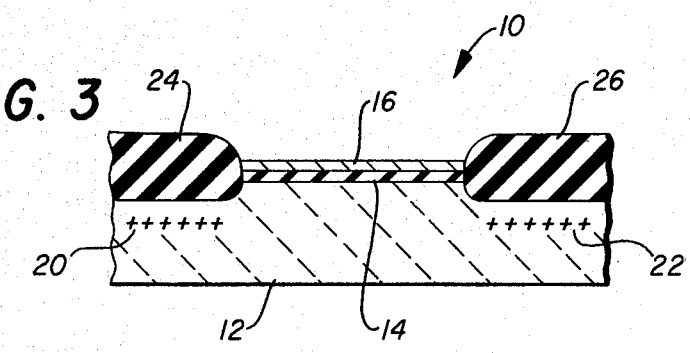
FIG. 3 is a cross-sctional view of the substrate of FIG. 2 in which field oxide has been grown on the surface of the substrate.

A boron ion implant is applied to the device shown in FIG. 2 to produce the P-type field regions 20 and 22 which are shown in FIG. 3. The regions 20 and 22 are approximately 5 microns apart and 500–1,500 angstroms deep.

Further referring to FIG. 3, the resist layer 18 is removed and the device 10 is subjected to an oxidizing environment which causes the growth of silicon dioxide to form field oxide regions 24 and 26.

Figure 4:
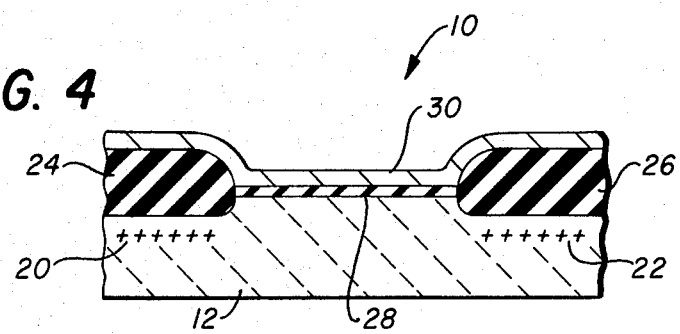
FIG. 4 is a cross-sectional view of the substrate of FIG. 3 in which a layer of polysilicon has been applied over the surface of the substrate.

Referring now to FIG. 4, the nitride layer 16 is removed by etching. The conventional process would require customer patterning at this time by doping the channel between regions 20 and 22. This would be achieved by photoresist masking with a boron ion implant. The openings in the photoresist mask would allow selected areas to receive the implant. However, these steps for implanting a bit pattern in the conventional process are not carried out in this manner with the method of the present invention. The oxide layers 14, 24 and 26 are etched such that the oxide layer 14 is removed and slight portions of field oxide layers 24 and 26 are also removed. A gate oxide layer 28 is then grown on the exposed surface of substrate 12. A layer of polysilicon 30 is then deposited over the entire surface of device 10.

Figure 5:
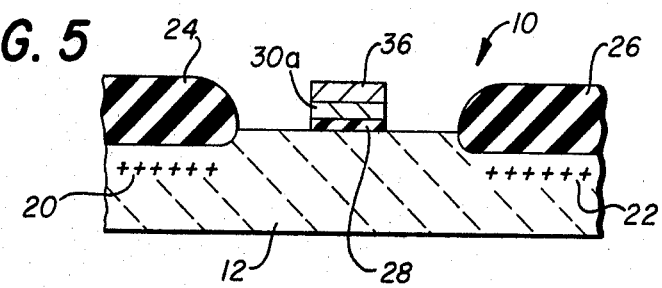
FIG. 5 is a cross-sectional view of the substrate of FIG. 4 in which a portion of the polysilicon layer has been etched.

Referring now to FIG. 5, a resist layer 36 has been patterned over the surface of device 10. A polysilicon etch has been applied to remove the polysilicon layer 30 other than that portion beneath the resist layer 36. The remaining portion of the oxide layer 30 will hereinafter be referred to as the poly gate 30a. An oxide etch is also applied to remove all of the gate oxide layer 28 other than the portion beneath the polygate 30a. The resist layer 36 is removed after the oxide etch.

Figure 6:
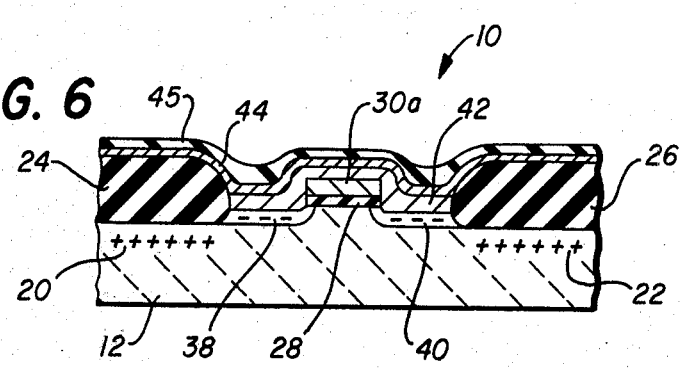
FIG. 6 is a cross-sectional view of the substrate of FIG. 5 in which oxide has been applied to cover the exposed surface of the substrate.

Referring now to FIG. 6, a phosphorus deposition and diffusion is applied to the substrate 12 to produce N-type regions 38 and 40. After the diffusion, a layer of thermal oxide 42 is grown on the surface of device 10 over poly gate 30a and the exposed regions of substrate 12 which comprise the phosphorus doped regions 38 and 40. Over the thermal oxide there is deposited a layer 44 of silicon nitride over which is deposited a layer 45 of silicon dioxide.

Figure 7:
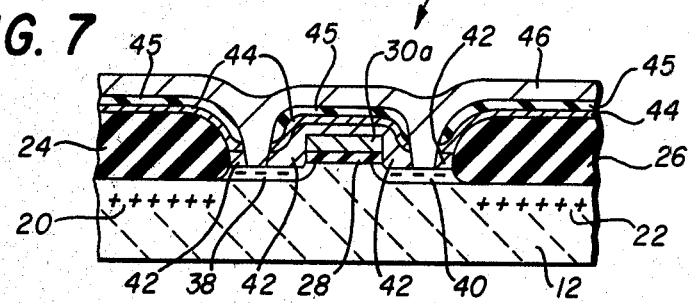
FIG. 7 is a cross-sectional view of the substrate of FIG. 6 in which the oxide has been etched and metal contacts have been applied to reach source and drain regions of the substrate.

Referring now to FIG. 7, the oxide layers 42 and 45 and the nitride layer 44 are etched above the regions 38 and 40 and a layer 46 of silicon doped aluminum is deposited on the surface of device 10 with a thickness of 10,000 to 12,000 angstroms to form contacts with the regions 38 and 40 in substrate 12.

Figure 8:
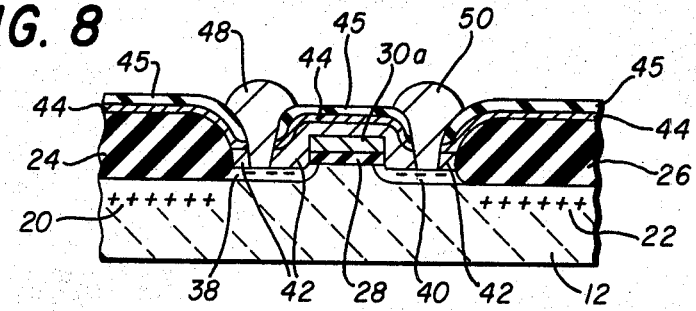
FIG. 8 is a cross-sectional view of the substrate of FIG. 7 in which the applied metallization has been etched to produce individual metal contacts.

Referring now to FIG. 8, the metallization layer 46 is masked and etched to define metal contacts 48 and 50 which are respectively connected to the regions 38 and 40 within the substrate 12. This level of metallization, layer 46, also defines the metal interconnects (not shown) used to connect various transistors. After the metal contacts 48 and 50 are formed, the device 10 is alloyed to form ohmic contacts to the substrate.

Figure 9:
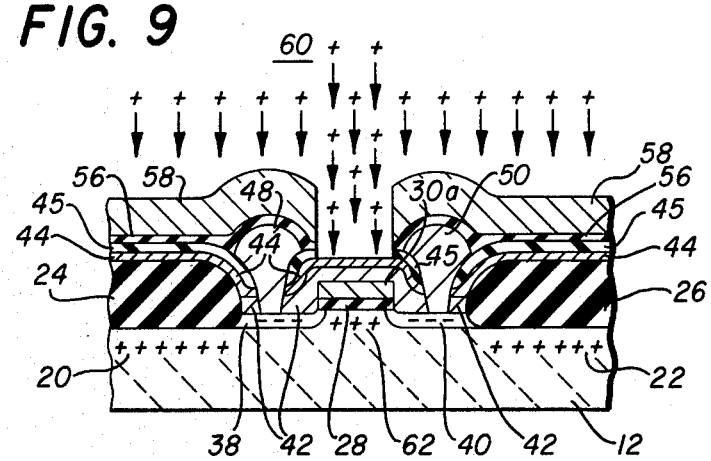
FIG. 9 is a cross-sectional view of FIG. 8 in which the oxide above the polysilicon gate has been etched and an ion implant has been applied such that the transistor formed therein has a greater threshold voltage.

Referring now to FIG. 9, a masking oxide layer 56 of silicon dioxide is deposited on the surface of the device 10. Over the oxide layer 56 there is patterned a resist layer 58, the pattern of which is defined by the customer code mask. For the circuit shown in FIG. 9, the customer code mask provides an opening in the resist layer 58 above the selected poly gate 30a. It is this masking step that defines which of the memory cells within the overall memory circuit are to receive the implant that increases the voltage threshold level of the cell from approximately 0.3 volts to approximately 4.5 volts. An oxide etch which includes acetic acid is applied to remove the majority of the oxide which is above the poly gate 30a. The acetic acid serves as a buffer to prevent etching the exposed aluminum. The etching stops when it reaches the nitride layer 44. A poly etch is then applied to remove silicon precipitate from the silicon doped aluminum over the exposed gates. Otherwise, the precipitate could block the ion implant to follow.

Further referring to FIG. 9, after the completion of these etching steps the poly gate 30a is covered by the nitride layer 44 which is approximately 400 angstroms thick and a thin coating of oxide 42, which also is approximately 400 angstroms thick. The layers 42 and 44 are fabricated generally to be in the range of 350–450 angstroms thick. The gate oxide 28 has been fabricated to have a thickness of approximately 1000 angstroms and the poly gate 30a has been fabricated to be approximately 4000 angstroms thick. The device 10 is exposed to an ion-implant operation in which an ionized material, such as boron, is projected onto the surface of device 10. The ions are depicted generally by the reference numeral 60. The ion-implant is carried out with a concentration of ions of approximately $1.30 \times 10^{13}$ ions per square centimeter. The ions are projected with an energy of approximately 360 KEV. The ions projected with this energy can penetrate the nitride layer 44, the remaining thin coating of oxide 42, the poly gate 30a, and gate oxide layer 28 to deposit the boron ions in the channel region of the substrate 12 between the regions 38 and 40. The implanted ions are represented generally by the reference numeral 62. The implant 62 is in the channel region of the memory cell between the doped regions 38 and 40 which serve as the drain and source of the transistor memory cell.

The projected ions have insufficient energy to effectively penetrate to the regions of the substrate not below the etched regions of the oxide layers 56 and 58. Therefore the implant is only in the substrate regions below the poly gate 30a which have the covering oxide etched away.

The ion implant operation has a number of effects upon the device 10 other than placement of the boron in the channel region of the memory cell. When the resist layer 58 is exposed to the ion stream it is hardened to the extent that conventional stripping agents cannot remove the resist. The high energy ions further cause damage to the crystal lattice of the silicon and if this damage is not corrected the functionality or reliability of the device could be damaged.

In order to remove the hardened resist layer 58 the device 10 is exposed to a plasma etch which serves to remove the resist layer 58.

In order to repair the damage caused by the ion-implant the device 10 is subjected to a low temperature annealing operation. A relatively low temperature is necessary since the silicon doped aluminum has been fabricated on the device 10 and therefore the annealing operation cannot be accomplished at the usual temperatures of 900° C. to 1000° C. since at that temperature range the metal would be melted. The device 10 is placed within an annealing furnace in a hydrogen atmosphere at a temperature of approximately 425° C. for two hours. This annealing operation repairs at least 90% of the damage caused by the ion-implantation, but it does not harm the metal which has a relatively low melting point.

Figure 10:
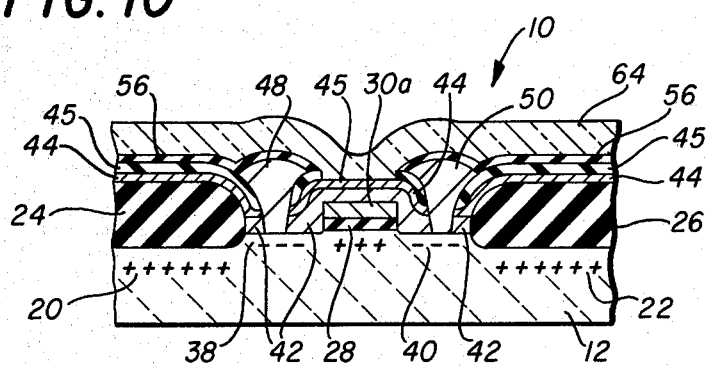
FIG. 10 is a cross-sectional view of the substrate of FIG. 9 in which a top layer of glass has been applied to the semiconductor device which has received the implant.

Referring now to FIG. 10, note that at this stage the resist layer 58 has been removed. After the removal of the resist layer 58, a layer 64 of phosphorus doped top glass is applied to cover the surface of the device 10. The coverage includes filling in the gap over the poly gate 30a. The glass layer 64 serves to protect the device 10 and to electrically insulate the various portions of the device 10.

Following the fabrication stage illustrated in FIG. 10, the glass layer 64 is etched to open bonding pads and the photoresist used in the glass etching is then removed.

The device 10 can be fabricated through the stage illustrated in FIG. 8 without committing the device to any particular bit pattern since at this point all of the cells are fabricated to have the same voltage threshold. It is at the ion-implantation state, shown in FIG. 9, that the bit pattern for a particular customer is implanted into the device 10. Therefore, after the devices have been manufactured as shown in FIG. 8 a library of such devices can be collected, parametrically tested and stored until an order is received. Upon receipt of the order and the customer's specified bit pattern, the selected memory cells are implanted to raise the voltage threshold levels. The final stages of processing as shown in FIGS. 9 and 10 are completed in a matter of days and the parts are then packaged and made ready for shipment to the customer. Thus, by delaying the implantation of the particular bit pattern until a very late stage in the processing, it is possible to significantly reduce the customer response time.

The nitride layer 44 seves to limit the etching of oxide layer 42 thereby enhancing device reliability by maintaining separation between the polysilicon and the metal. With controlled etching the nitride layer 44 can be completely eliminated from the manufacturing process which in turn eliminates the nitride etching steps. Referring to FIG. 9, the oxide etching will extend down essentially to the surface of poly gate 30a if the nitride layer 44 is not included. In such a case the resulting device would be as shown in FIG. 10 but with the layer 64 extending down to the surface of poly gate 30a.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

What is claimed is:

1. A method for producing a ROM semiconductor device having a selected bit pattern implanted therein, comprising the steps of:
   (a) fabricating a plurality of memory cells on a semiconductor substrate wherein the memory cells are separated by field oxide, each cell having doped source and drain regions in the substrate on each side of a non-implanted channel region, a gate oxide immediately above the channel region, a polysilicon gate immediately above the gate oxide, a first oxide layer above the polysilicon gate, a nitride layer above the oxide layer, a second oxide layer above the nitride layer and metal contacts extending through the first and second oxide layers and the nitride layer for contact with the respective source and drain regions;
   (b) depositing a third oxide layer to cover the surface of said device;
   (c) etching the second and third oxide layers to expose the nitride layer above the channel regions of selected ones of said memory cells in accordance with said selected bit patterns;
   (d) after etching said second oxide layer, exposing the device to a stream of ions having sufficient energy to penetrate the exposed nitride layer, the first oxide layer, the polysilicon gate and underlying gate oxide to implant the corresponding channel regions of each of the selected memory cells thereby changing the voltage thresholds of the selected memory cells, the ions having insufficient energy to effectively penetrate to the regions of said substrate not below the etched regions of said second oxide layer; and
   (e) covering the surface of said device with a passivation layer after implanting the channel regions of the selected memory cells.

2. The method recited in claim 1 including the step of polysilicon etching said device after the step of etching said second oxide layer and before the step of exposing the device to a stream of ions, to remove silicon precipate from above said polysilicon gate.

3. The method recited in claim 1 including the steps of depositing a third oxide layer to cover the surface of said device before the step of etching, and etching said third layer along with said second layer.

4. The method recited in claim 1 wherein the step of fabricating said memory cells includes the steps of fabricating said polysilicon gate to have a thickness in the range of 3,000 to 5,000 angstroms, said gate oxide to have a thickness in the range of 800–1,200 angstroms, said first oxide layer to have a thickness in the range of 350–450 angstroms and said nitride layer to have a thickness in the range of 350–450 angstroms.

* * * * *